(12) United States Patent
Teng et al.

(10) Patent No.: US 8,037,089 B2
(45) Date of Patent: Oct. 11, 2011

(54) TEST SYSTEM

(75) Inventors: Cheng-Yung Teng, Taipei County (TW); Yi-Chang Hsu, Taipei County (TW); Jie-Wei Huang, Taipei County (TW)

(73) Assignee: Princeton Technology Corporation, Hsin Tien, Taipei County (TW)

( * ) Notice: Subject to any disclaimer, the term of this patent is extended or adjusted under 35 U.S.C. 154(b) by 387 days.

(21) Appl. No.: 12/260,484

(22) Filed: Oct. 29, 2008

(65) Prior Publication Data

US 2009/0113260 A1    Apr. 30, 2009

(30) Foreign Application Priority Data

Oct. 30, 2007    (TW) .............................. 96218200 U

(51) Int. Cl.
G06F 7/00    (2006.01)
G06F 17/30    (2006.01)

(52) U.S. Cl. ........ 707/770; 707/804; 707/812; 714/724; 714/742; 324/537; 324/763; 324/765

(58) Field of Classification Search .................. 707/770, 707/804, 812; 714/724, 742; 324/537, 763, 324/765
See application file for complete search history.

(56) References Cited

U.S. PATENT DOCUMENTS

| | | | | | |
|---|---|---|---|---|---|
| 4,412,327 | A | * | 10/1983 | Fox et al. | 714/721 |
| 5,969,835 | A | * | 10/1999 | Kamieniecki et al. | 340/12.52 |
| 6,028,439 | A | * | 2/2000 | Arkin et al. | 324/537 |
| 6,449,741 | B1 | * | 9/2002 | Organ et al. | 714/724 |
| 7,096,139 | B2 | * | 8/2006 | Miyazaki et al. | 702/117 |
| 7,603,598 | B2 | * | 10/2009 | Hong et al. | 714/724 |
| 7,642,801 | B2 | * | 1/2010 | Teng et al. | 324/750.3 |
| 7,706,999 | B2 | * | 4/2010 | Teng et al. | 324/750.01 |
| 7,830,163 | B2 | * | 11/2010 | Teng et al. | 324/756.02 |
| 7,855,571 | B2 | * | 12/2010 | Teng et al. | 324/762.02 |
| 2001/0005132 | A1 | * | 6/2001 | Nishikawa et al. | 324/158.1 |
| 2002/0199142 | A1 | * | 12/2002 | Gefen | 714/724 |
| 2005/0168233 | A1 | * | 8/2005 | Roberts et al. | 324/763 |
| 2005/0182583 | A1 | * | 8/2005 | Miyazaki et al. | 702/117 |
| 2007/0024314 | A1 | * | 2/2007 | Teng et al. | 324/765 |
| 2007/0075719 | A1 | * | 4/2007 | Chung et al. | 324/765 |
| 2007/0268037 | A1 | * | 11/2007 | Teng et al. | 324/765 |
| 2008/0063212 | A1 | * | 3/2008 | Teng et al. | 702/66 |
| 2008/0191730 | A1 | * | 8/2008 | Teng et al. | 324/765 |
| 2009/0254296 | A1 | * | 10/2009 | Teng et al. | 702/117 |

(Continued)

OTHER PUBLICATIONS

Su et al.—"A Computer Aided Engineering System for Memory BIST"—ASP-DAC'01 Proceedings of the 2001 Asia and South Pacific Design Automation Cpnference, 2001 IEEE (pp. 492-495).*
Tang et al.—"In System Emulation (ISE) of a Current Differential Back-up Protection Relay"—SCSC Proceedings of the 2007 summer computer simulation conference—SCSC 2007 (pp. 70-75).*

*Primary Examiner* — John E Breene
*Assistant Examiner* — Ahn Ly
(74) *Attorney, Agent, or Firm* — Muncy, Geissler, Olds & Lowe, PLLC

(57) ABSTRACT

A test system for testing a plurality of devices under test is disclosed. The test system includes a tester and a plurality of processors. The tester is used for providing a plurality of control signals and determining a plurality of test results for the devices under test according to a plurality of measurement results. Each processor coupled to the tester is used for generating a plurality of test signals according to the plurality of control signals. The plurality of devices under test respectively generates the plurality of test results according to the plurality of test signals.

14 Claims, 4 Drawing Sheets

U.S. PATENT DOCUMENTS

2009/0281744 A1* 11/2009 Teng et al. .................. 702/64
2009/0302861 A1* 12/2009 Teng et al. .................. 324/537
2009/0326844 A1* 12/2009 Teng et al. .................. 702/65
2010/0313089 A1* 12/2010 Rajski et al. ................. 714/731

* cited by examiner

TEST SYSTEM

BACKGROUND OF THE INVENTION

1. Field of the Invention

The present invention relates to a test system, and in particular relates to a test system capable of simultaneously testing several devices under test.

2. Description of the Prior Art

To ensure the quality of each electronic device for sales, a test is performed to determine whether the electronic device, such as an integrated circuit, a wafer or a chip, meets qualification standards.

FIG. 1 is a schematic diagram of testing a single device. Here, the device is a chip. A tester 10 sends a control command via a general purpose interface bus (GPIB) 12 to control a measuring instrument 14, and measures a chip under test 16 via the measuring instrument 14. The test result $T_R$ generated by the chip under test 16 is sent to the tester 10 for data analysis, and finally the tester 10 determines if the chip under test 16 passes the test. With this method, the tester 10 can only test a single chip under test 16 at a time, hindering mass production efficiency.

FIG. 2 is a schematic diagram of testing several devices. Here, the devices are chips. A tester 20 sends a control command via a GPIB 22 to control measuring instruments 241-243, and switches relays 261-263 via the measuring instruments 241-243 to measure the corresponding chips tinder test 281-283, and then the test results $T_{R1}$-$T_{R3}$ of the chips under test 281-283 are sent to the tester 20 for data analysis. However, since the command address of the tester 20 supports only one measuring instrument at a time, it is necessary to use the relays 261-263 to control the measuring process, thus hindering the time it takes to test several chips under test 281-283 in one working period due to the chip testing serial structure.

For the chip testing methods mentioned above, much time is required when testing a multitude of chips under test. Thus, a novel test system which raises chip testing efficiency for testing several chips simultaneously, without drastically increasing costs is desired.

BRIEF SUMMARY OF INVENTION

One purpose of this invention provides a test system for simultaneously testing several devices, such as chips, wavers or integrated circuits, to solve the abovementioned deficiencies.

This invention discloses a test system testing several devices under test (DUTs). This test system comprises a tester and several processors. The tester provides several control signals, and determines the test results of the DUTs according to the measurement results generated by the DUTs. Processors are coupled to the tester to generate several test signals according to the control signals, wherein the DUTs, respectively generate measurement results according to the test signals.

DETAILED DESCRIPTION OF INVENTION

Figure 1:
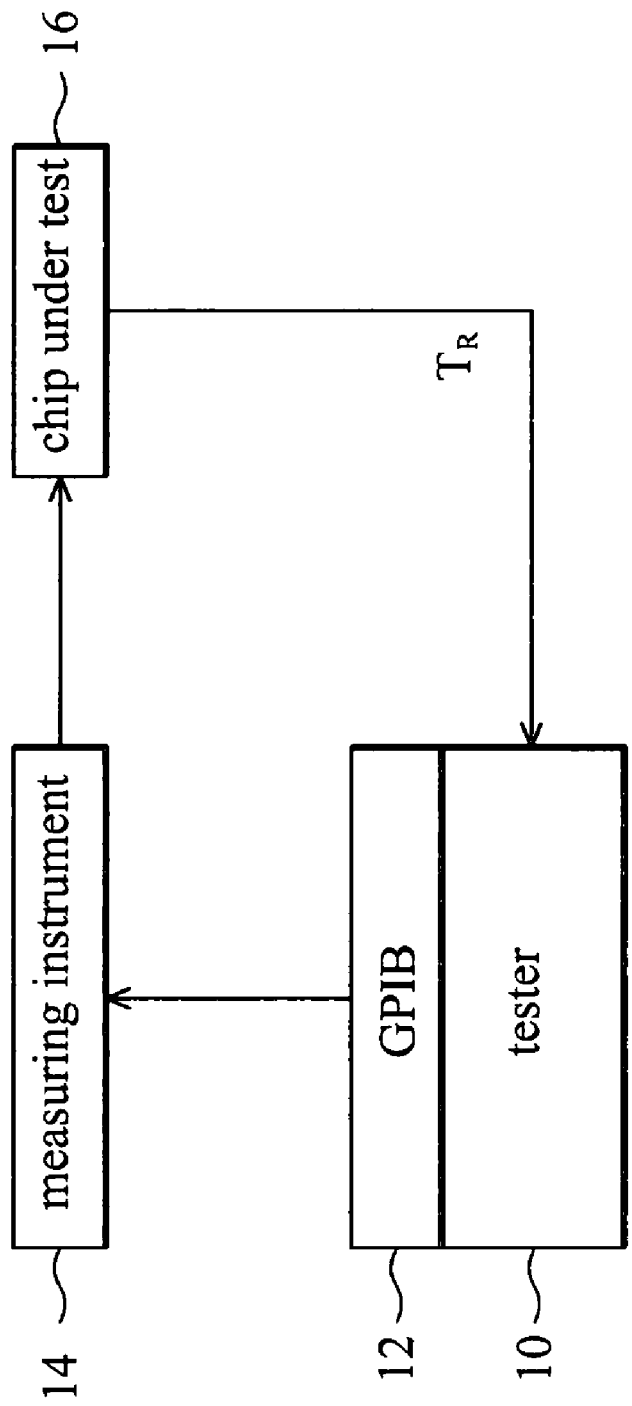
FIG. 1 is a schematic diagram of testing a single chip.
Figure 2:
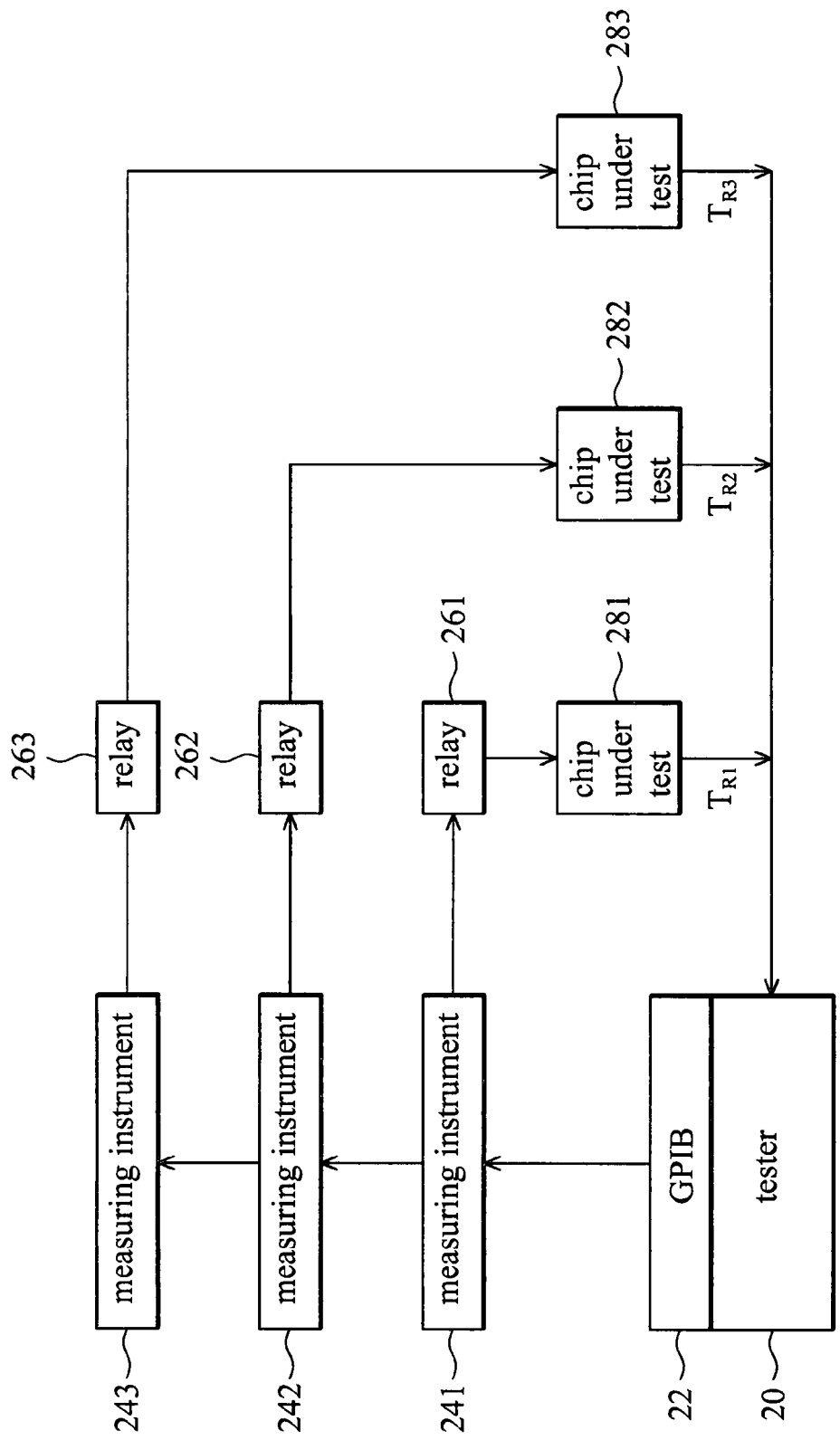
FIG. 2 is a schematic diagram of testing several chips.
Figure 3:
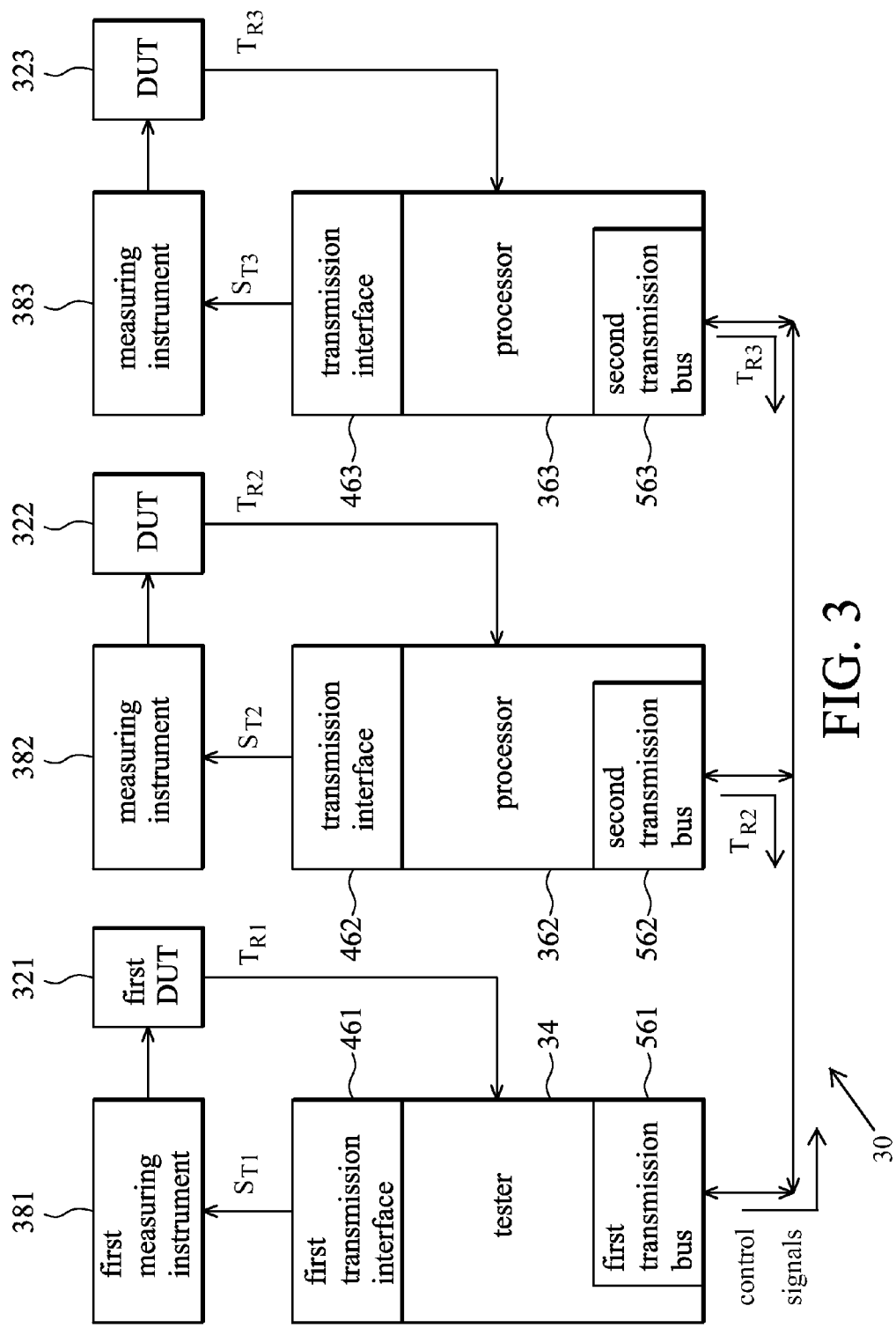
FIG. 3 is a schematic diagram of the test system of this invention.

FIG. 3 is a schematic diagram of the test system of this invention. The test system 30 is used to test several devices under test (DUTs) 321-323. The test system 30 comprises a tester 34 and several processors 362-363. The tester 34 provides several control signals, and determines the test results of DUTs 321-323 according to the measurement results $T_{R1}$-$T_{R3}$ generated by the DUTs 321-323. The processors 362-363 are coupled to the tester 34 to generate test signals $S_{T2}$-$S_{T3}$ according to the control signals. The DUTs 322-323 respectively generate the measurement results $T_{R2}$-$T_{R3}$ according to the test signals $S_{T2}$-$S_{T3}$. In one embodiment, the tester 34 is a logic tester, and the DUTs 321-323 are integrated circuits (ICs). The tester 34 generates interface control signals according to the test signals $S_{T1}$-$S_{T3}$, and then determines the test results of the DUTs 321-323 according to the interface control signals.

The test system 30 also comprises several measuring instruments 382-383, coupled to the processors 362-363 and the DUTs 322-323, measuring the DUTs 322-323 according to the test signals $S_{T2}$-$S_{T3}$. The processors 362-363 respectively include transmission interfaces 462-463, coupled to measuring instruments 382-383, transmitting the test signals $S_{T2}$-$S_{T3}$ to the corresponding measuring instruments 382-383. In one embodiment, the transmission interfaces 462-463 are GPIBs.

Moreover, the tester 34 includes a determination module (not shown), coupled to the processors 362-363, determining the test results of DUTs 322-323 according to the measurement results $T_{R2}$-$T_{R3}$.

In one embodiment, the tester 34 comprises a first transmission bus 561, coupled to the processors 362-363, respectively transmitting the control signals to the processors 362-363, and receiving the measurement results $T_{R2}$-$T_{R3}$. The processors 362-363 respectively include second transmission buses 562-563 receiving the control signals transmitted by the coupled first transmission bus 561. The processors 362-363 respectively include registers (not shown), for the storage of the measurement results $T_{R2}$-$T_{R3}$ generated by the DUTs 322-323 during the test. Finally, the measurement results $T_{R2}$-$T_{R3}$ are transmitted to the tester 34 to determine the test results of the DUTs 322-323.

The test system 30 also comprises a first DUT 321, and the tester 34 generates a first test signal $S_{T1}$, which the first DUT 321 generates a first measurement result $T_{R1}$ based on. Additionally, the tester 34 includes a first measuring instrument 381, coupled to the tester 34 and the first DUT 321, measuring the first DUT 321 according to the first test signal $S_{T1}$. The determination module (not shown) in the tester 34 determines the test result of the first DUT 321, according to the first measurement result $T_{R1}$ generated by the first DUT 321. The tester 34 generates the interface control signals by the first measurement result $T_{R1}$ and the other measurement results $T_{R2}$-$T_{R3}$, and then determines the test results of the DUTs 321-323.

The tester 34 further includes a first transmission interface 461 transmitting the coupled first test signal $S_{T1}$ to the first measuring instrument 381. In one embodiment, the first transmission interface 461 is a GPIB.

In FIG. 3, the DUTs 321-323 may be integrated circuits, chips or wafers. Thus, the test system respectively performs IC final testing, chip testing and wafer probing testing to the integrated circuits, chips and wafers.

Figure 4:
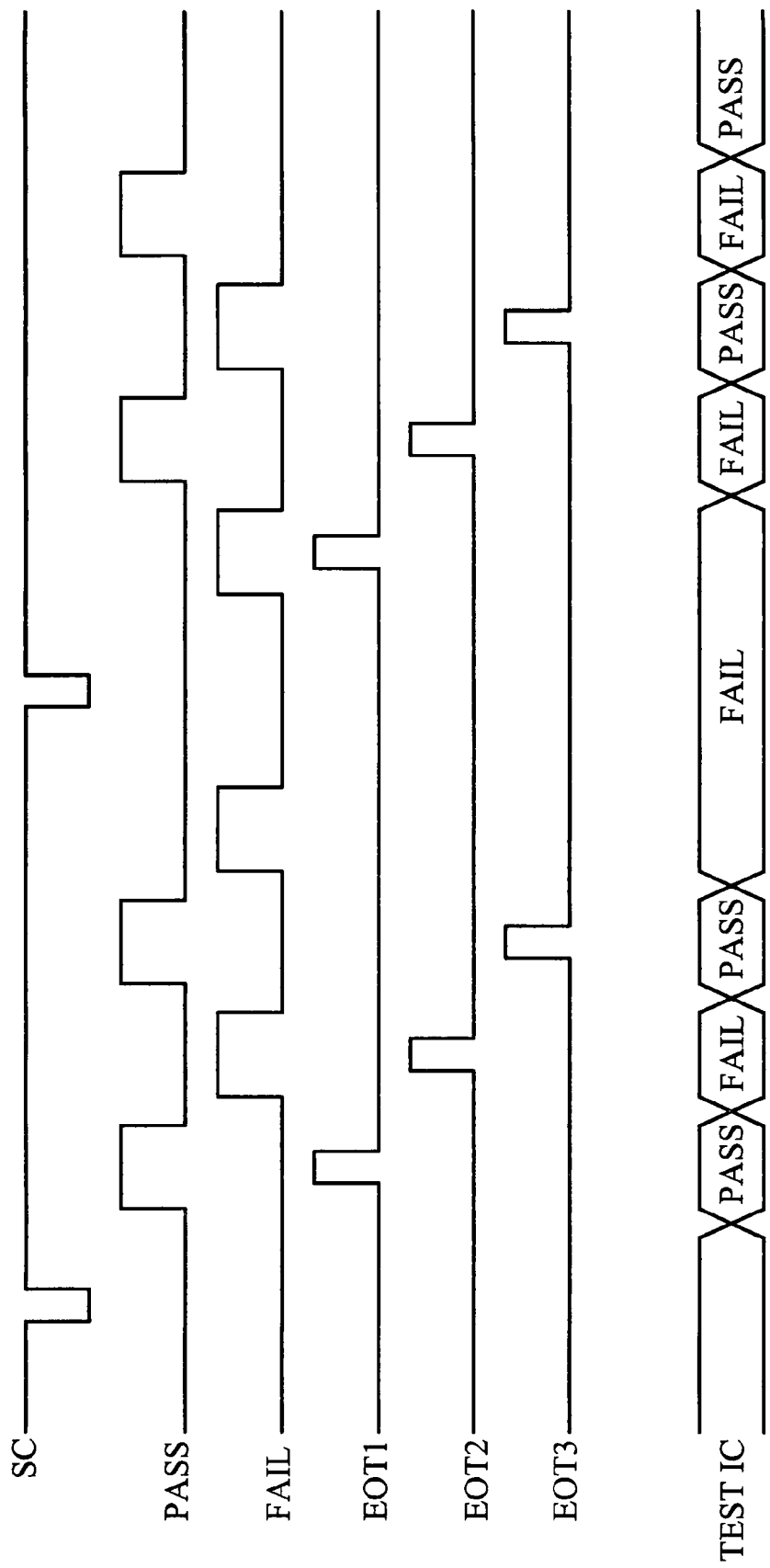
FIG. 4 is a waveform of interface control signals of the test system of this invention.

FIG. 4 is a waveform of interface control signals of the test system of this invention. After the test is done, the tester 34 generates interface control signals according to the measurement results stored in each processor, and then the determination module (not shown) determines the test results of the DUTs 322-323 according to the interface control signals. The interface control signals include several end of test signals (EOT signals) EOT1-EOT3, a pass signal PASS and a fail signal FAIL. The EOT signals EOT1-EOT3 represents respective completion of the DUT 321-323 tests. The pass signal PASS represents a DUT passing the test, and the fail signal FAIL represents a DUT failing the test. As shown in FIG. 4, for the example of the first test activated by the control signal SC, the test results of the DUTs 321 and 323 corresponding to the EOT1 and EOT3 were passing, and the test result of the DUT 322 corresponding to the EOT2 was failing.

Conventional testing methods can only test one single device (IC, chip or wafer) at a time, or for serial testing methods, much time is required when testing a multitude of devices. Compared to the testing structure of the prior art, the test system of this invention uses the concept of parallel testing, wherein the tester can not only test a first device under test, but also be coupled to several processors for testing several DUTs. Therefore, test system of this invention can simultaneously test several devices, and raise the efficiency of device-testing.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A test system, for testing a plurality of devices under test (DUTs), comprising:
   a tester, providing a plurality of control signals; and determining a plurality of test results for the DUTs according to a plurality of measurement results generated by the DUTs, wherein the tester includes a first measuring instrument, coupled to the tester and the first DUT, for measuring the first DUT according to the first test signal; and
   a plurality of processors, coupled to the tester, generating a plurality of test signals according to the plurality of control signals, wherein the plurality of DUTs generate the plurality of measurement results according to the plurality of test signals;
   wherein the tester generates an interface control signal according to the plurality of measurement results, and determines the plurality of test results for the DUTs according to the interface control signals; and
   wherein the interface control signals include a plurality of end of test signals (EOT signals) indicating when different DUT tests are finished, a pass signal indicating when a DUT corresponding to an EOT signal passes a test, and a fail signal indicating when a DUT corresponding to an EOT signal fails a test.

2. The test system as claimed in claim 1, further comprises a plurality of measuring instruments, coupled to the plurality of processors and the DUTs, respectively, for measuring the plurality of DUTs according to the plurality of test signals.

3. The test system as claimed in claim 2, wherein each processor comprises a transmission interface, coupled to a corresponding one of measuring instruments, for transmitting the plurality of test signals to the corresponding plurality of measuring instruments.

4. The test system as claimed in claim 3, wherein each transmission interface is a general purpose interface bus (GPIB).

5. The test system as claimed in claim 2, further comprises a first DUT, wherein according to a first test signal produced by the tester, the first DUT generates a first measurement result, and the tester determines the test result of the first DUT according to the first measurement result produced by the first DUT.

6. The test system as claimed in claim 5, wherein the tester generates an interface control signal according to the first measurement result, and then determines the test results of the first DUT according to the interface control signal.

7. The test system as claimed in claim 6, wherein the tester includes a determination module, for determining the test results of the plurality of DUTs according to the interface control signal.

8. The test system as claimed in claim 5, wherein the tester is a logic tester.

9. The test system as claimed in claim 5, wherein the plurality of the DUTs are integrated circuits (ICs).

10. The test system as claimed in claim 1, wherein the tester include a first transmission interface, coupled to the first measuring instrument, for transmitting the first test signal to the first instrument.

11. The test system as claimed in claim 10, wherein the first transmission interface is a general purpose interface bus (GPIB).

12. The test system as claimed in claim 1, wherein the tester includes a first transmission bus, coupled to the plurality of processors, for transmitting the plurality of control signals to the plurality of processors, and receiving the plurality of measurement results.

13. The test system as claimed in claim 12, wherein the plurality of processors include a second transmission bus, for receiving the plurality of control signals from the coupled first transmission bus, and transmitting the plurality of measurement results.

14. The test system as claimed in claim 1, wherein each of the plurality of processors includes a register for storing the plurality of the measurement results generated by the DUTs.

* * * * *